(12) United States Patent
Wu et al.

(10) Patent No.: US 11,923,841 B2
(45) Date of Patent: Mar. 5, 2024

(54) PROXIMITY SENSOR

(71) Applicant: EMINENT ELECTRONIC TECHNOLOGY CORP. LTD., Hsin-Chu (TW)

(72) Inventors: Kao-Pin Wu, New Taipei (TW); Yuh-Yuan Wang, Hsinchu (TW)

(73) Assignee: EMINENT ELECTRONIC TECHNOLOGY CORP. LTD., Hsin-Chu (TW)

( * ) Notice: Subject to any disclaimer, the term of this patent is extended or adjusted under 35 U.S.C. 154(b) by 0 days.

(21) Appl. No.: 18/189,881

(22) Filed: Mar. 24, 2023

(65) Prior Publication Data

US 2023/0327668 A1 Oct. 12, 2023

Related U.S. Application Data

(60) Provisional application No. 63/327,802, filed on Apr. 6, 2022.

(30) Foreign Application Priority Data

Jan. 17, 2023 (TW) .................................. 112102009

(51) Int. Cl.
*H03K 17/945* (2006.01)
*G01S 17/04* (2020.01)
*H03K 17/94* (2006.01)

(52) U.S. Cl.
CPC ............ *H03K 17/945* (2013.01); *G01S 17/04* (2020.01); *H03K 17/941* (2013.01); *H03K 2017/9455* (2013.01)

(58) Field of Classification Search
CPC ....................................................... G01S 17/04
See application file for complete search history.

(56) References Cited

U.S. PATENT DOCUMENTS

| | | | | |
|---|---|---|---|---|
| 6,054,927 A | * | 4/2000 | Brickell | G01V 8/10 340/552 |
| 6,330,279 B1 | * | 12/2001 | Belser | H03K 5/02 375/238 |
| 6,819,781 B1 | * | 11/2004 | Simpkins | G07D 7/12 356/71 |
| 8,283,620 B2 | * | 10/2012 | Raynor | H03F 3/087 250/214 R |

(Continued)

*Primary Examiner* — Khareem E Almo
(74) *Attorney, Agent, or Firm* — Muncy, Geissler, Olds & Lowe, P.C.

(57) ABSTRACT

A proximity sensor includes a light source, an optical sensing element, and an integration circuit. The light source is turned on and off several times during a measurement time interval. When the light source is turned on and off, the optical sensing element senses the surrounding light to generate a first current and a second current, respectively. The integration circuit integrates the first current and the second current to generate a first integration signal and a second integration signal respectively for determining whether an object is approaching. When the light source is turned on, the present second integration signal is stored, and a stored first integration signal is used as a starting value to integrate the first current. When the light source is turned off, the present first integration signal is stored, and the stored second integration signal is used as a starting value to integrate the second current.

4 Claims, 6 Drawing Sheets

(56) References Cited

U.S. PATENT DOCUMENTS

| | | | | |
|---|---|---|---|---|
| 10,412,813 | B1* | 9/2019 | Chen | H05B 47/105 |
| 11,470,271 | B2* | 10/2022 | Kim | H04N 25/60 |
| 11,692,872 | B2* | 7/2023 | Adusumalli | G01J 1/44 |
| | | | | 250/208.2 |
| 2010/0065720 | A1* | 3/2010 | Raynor | H03F 3/087 |
| | | | | 250/201.1 |
| 2020/0099388 | A1* | 3/2020 | Lesso | H03K 7/02 |
| 2022/0299362 | A1* | 9/2022 | Adusumalli | H03F 3/45475 |
| 2023/0111486 | A1* | 4/2023 | Shah | G01S 7/4865 |
| | | | | 356/5.01 |
| 2023/0324222 | A1* | 10/2023 | Wu | G01J 1/46 |
| | | | | 250/214 R |

\* cited by examiner

PROXIMITY SENSOR

This application claims priority for the U.S. provisional patent application No. 63/327,802 filed on 6 Apr. 2022, and TW patent application no. 112102009 filed on 17 Jan. 2023, the content of which is incorporated by reference in its entirely.

BACKGROUND OF THE INVENTION

Field of the Invention

The present invention relates to an optical light sensor, particularly to a proximity sensor.

Description of the Prior Art

FIG. 1 shows a traditional proximity sensor. FIG. 2 shows the circuit of the proximity sensor shown in FIG. 1. As shown in FIG. 1 and FIG. 2, 20 the proximity sensor 10 comprises a light source 11 and an optical sensing circuit 12. The light source 11 includes a light-emitting diode (LED) 111 and a light source switch SW1 connected in series with the LED 111. While a control signal S1 controls the light source switch SW1 to turn on, the LED 111 emits a light L1. The light L1 is projected to an object 20, and then reflected by the object 20 to the proximity sensor 10. The optical sensing circuit 12 senses the reflected light L' from the object 20 to determine whether the object 20 is approaching. The optical sensing circuit 12 includes an optical sensing element 121, an integration circuit 122, a comparator 123, a reset circuit 124, and a counter 125. The optical sensing element 121 senses the reflected light L' and the ambient light to generate a current Iph. The integration circuit 122 is coupled to the optical sensing element 121 and is configured to integrate the current Iph' to generate an integration signal Pout. While a reset switch SW2 of the reset circuit 124 is turned off, the current Iph'=Iph. While the reset switch SW2 of the reset circuit 124 is turned on, the current Iph'=Iph-If. The integration circuit 122 includes an operational amplifier 1221 and a capacitor C1. The inverting input terminal and the non-inverting input terminal of the operational amplifier 1221 are respectively coupled to the optical sensing element 121 and a ground terminal GND. The capacitor C1 is coupled between the inverting input terminal and the output terminal of the operational amplifier 1221. The comparator 123 is coupled to the integration circuit 122 and compares the integration signal Pout with a reference voltage Vref to generate a comparison signal D1, wherein the reference voltage Vref is a threshold value. While the integration signal Pout is greater than the reference voltage Vref, the comparator 123 outputs a comparison signal D1 with a high level such that the reset switch SW2 of the reset circuit 124 is turned on to reset the integration signal Pout. The reset circuit 124 includes a current source 1241 and a reset switch SW2, wherein the reset switch SW2 is coupled between the current source 1241 and the integration circuit 122 and controlled by the comparison signal D1. While the reset switch SW2 is turned on by the comparison signal D1, the current source 1241 provides a current If to reset the integration signal Pout. The counter 125 is coupled to the comparator 123 and configured to count the number of the high-level comparison signals D1 to generate a sensing value O. The optical sensing circuit 12 determines whether the object 20 is approaching according to the sensing value O.

In addition to the reflected light L', the optical sensing circuit 12 also senses the ambient light, however. In order to accurately determine the intensity of the reflected light L', the interference from the ambient light must be eliminated. FIG. 3 is to explain the sensing method of the proximity sensor 10 shown in FIG. 2. In FIG. 2, the waveform 30 represents the control signal S1 and the waveform 31 represents the intensity of the ambient light. Refer to FIG. 2 and FIG. 3. The proximity sensor 10 senses light during a measurement time interval Ts to determine whether an object 20 is approaching. Each measurement time interval Ts includes a light turn-on interval Ton and a light turn-off interval Toff, wherein the length of light turn-on interval Ton is equal to the length of the light turn-off interval Toff. In the case that the object 20 is approaching during the light turn-on interval Ton, the control signal S1 turns on the light source switch SW1. Thus, the light source 11 emits the light L1, and the optical sensing circuit 12 senses the reflected light L' and the ambient light to generate a sensing value O1. During the light turn-off interval Toff, the control signal S1 turns off the light source switch SW1. Thus, the light source 11 stops emitting the light L1, and the optical sensing circuit 12 senses the ambient light to generate a sensing value O2. Theoretically, subtracting the sensing value O2 from the sensing value O1 may eliminate the interference from the ambient light and obtain the intensity of the reflected light L1.

However, as shown by the waveform 31 in FIG. 3, the intensity of the ambient light is not always constant. The intensity of the ambient light sensed in the light turn-on interval may be different from the intensity of the ambient light sensed in the light turn-off interval. For example, while the intensity of the ambient light in the light turn-on interval is obviously greater than the intensity of the ambient light in the light turn-off interval, subtracting the sensing value O2 from the sensing value O1 is unable to eliminate the interference from the ambient light. In such a case, the proximity sensor 10 may determine that an object is approaching although there is no object approaching in fact.

SUMMARY OF THE INVENTION

One objective of the present invention is to provide a proximity sensor able to reduce an interference from an ambient light.

According to one embodiment of the present invention, a proximity sensor comprises a light source, an optical sensing element, an integration circuit, a comparator, a first counter, a second counter, and a reset circuit. The light source is configured to generate a light, which is turned on and off several times during a measurement time interval. The optical sensing element is configured to sense a reflected light and an ambient light, wherein the reflected light is generated by an object reflecting the light. While the light source is turned on, the optical sensing element generates a first current. While the light source is turned off, the optical sensing element generates a second current. The integration circuit is configured to integrate the first current and the second current to respectively generate a first integration signal and a second integration signal. The comparator is coupled to the integration circuit and is configured to compare the first integration signal and the second integration signal with a threshold value to generate a comparison signal. While the first integration signal is greater than the threshold value, the comparison signal is at a first level to reset the first integration signal. While the second integration signal is greater than the threshold value, the comparison signal is at the first level to reset the second integration signal. The first counter is coupled to the comparator and is configured to count the number of the comparison signal at the first level in the plurality of turn-on intervals of the light source during the measurement time interval so as to generate a first sensing value. The second counter is coupled to the comparator and is configured to count the number of the comparison signal at the first level in the plurality of turn-off intervals of the light source during the measurement time interval so as to generate a second sensing value. The reset circuit is coupled to the integration circuit, is configured to reset the first integration signal according to the comparison signal while the light source is turned on, and is configured to reset the second integration signal according to the comparison signal while the light source is turned off. The integration circuit includes an operational amplifier, a first capacitor, a first switch, a second capacitor, and a second switch. The operational amplifier includes a non-inverting input terminal, an inverting input terminal, and an output terminal. The non-inverting input terminal is coupled to a ground terminal. The inverting input terminal is coupled to the optical sensing element. The first switch is connected in series with the first capacitor. The first capacitor and the first switch are coupled between the non-inverting terminal and the output terminal. While the light source is turned on, the first switch is turned on to make the first capacitor generate the first integration signal. The second switch is connected in series with the second capacitor and connected in parallel with the first switch. The second capacitor and the second switch are coupled between the inverting input terminal and the output terminal. While the light source is turned off, the second switch is turned on to make the second capacitor generate the second integration signal.

In the proximity sensor of the present invention, the light source is turned on and off several times during a measurement time interval, whereby the length of each of the turn-on intervals and turn-off intervals of the light source is shorter. Thus, the difference of the intensities of the ambient light in the adjacent turn-on interval and turn-off interval is smaller. Then is effectively decreased the interference from the ambient light and increased the accuracy of the proximity sensor.

DETAILED DESCRIPTION OF THE INVENTION

Figure 4:
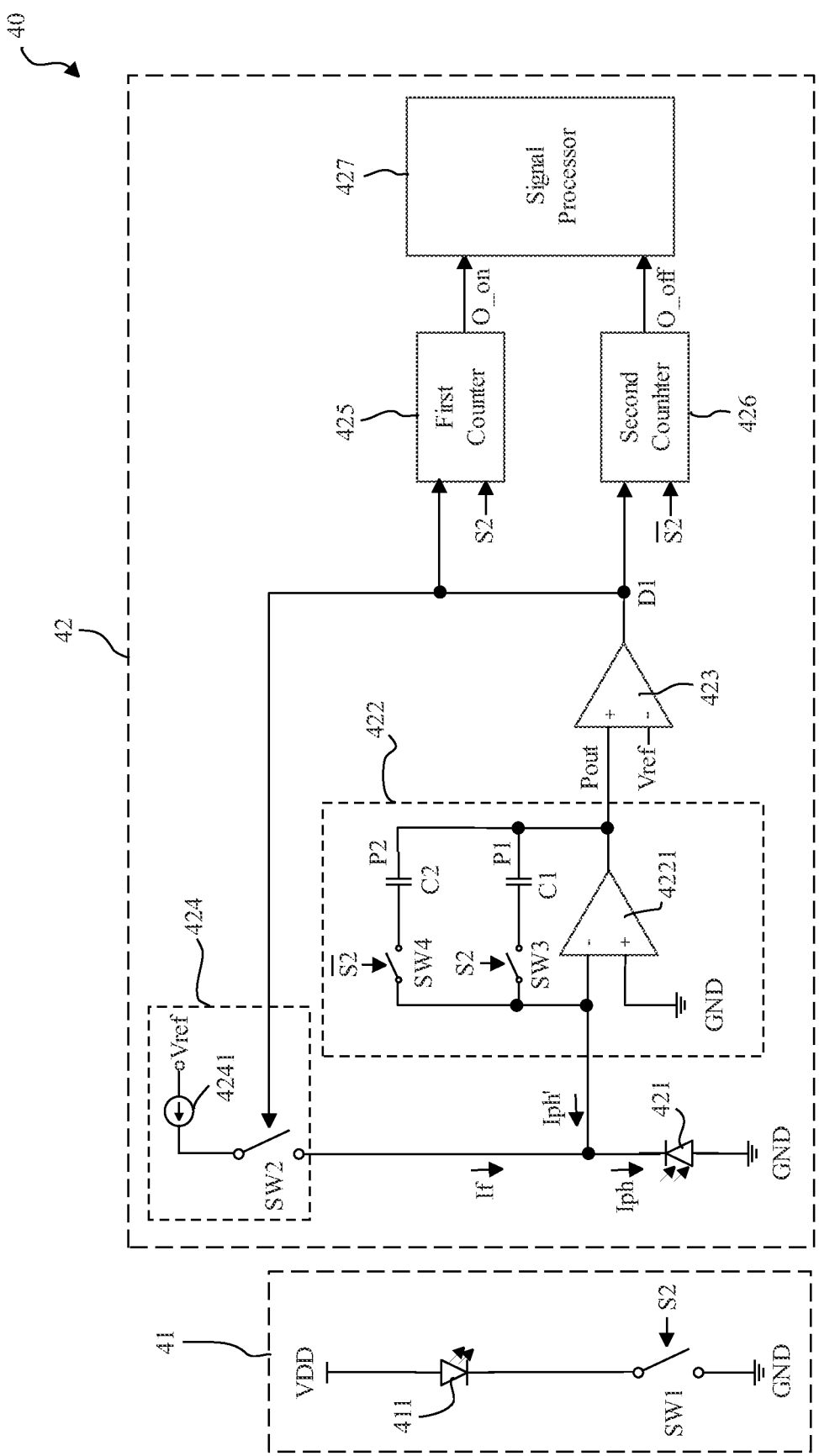
FIG. 4 schematically shows a circuit of a proximity sensor according to one embodiment of the present invention.

FIG. 4 schematically shows a circuit of a proximity sensor according to one embodiment of the present invention. In FIG. 4, the proximity sensor 40 comprises a light source 41 and an optical sensing circuit 42. The light source 41 is used to generate a light L1. The light source 41 includes a light-emitting diode (LED) 411 and a light source switch SW1, wherein The LED 411 and the light source switch SW1 are connected in series. In another embodiment, the LED 411 may be replaced by another light-emitting element. While a control signal S2 controls the light source switch SW1 to turn on, the LED 411 emits the light L1. The light L1 is emitted to an object 20, and then is reflected to the proximity sensor 40. The optical sensing circuit 42 senses a reflected light L1' from the object 20 to determines whether the object 20 is approaching. The optical sensing circuit 42 includes an optical sensing element 421, an integration circuit 422, a comparator 423, a reset circuit 424, a first counter 425, a second counter 426, and a signal processor 427. The optical sensing element 421 is used to sense the ambient light and/or the reflected light L1' to generate a current Iph. The optical sensing element 421 may be but is not limited to be a photodiode. The integration circuit 422 is coupled to the optical sensing element 421 and used to integrate a current Iph' to generate an integration signal Pout. While a reset switch SW2 of the reset circuit 424 is turned off, Iph'=Iph. While the reset switch SW2 of the reset circuit 424 is turned on, Iph'=Iph-If. The integration circuit 422 includes an operational amplifier 4221, a first capacitor C1, a second capacitor C2, a first switch SW3, and a second switch SW4. An inverting input terminal and a non-inverting input terminal of the operational amplifier 4221 are respectively coupled to the optical sensing element 421 and a ground terminal GND. The first capacitor C1 is connected in series with the first switch SW3 and coupled between the inverting input terminal and the output terminal of the operational amplifier 4221. The second capacitor C2 is connected in series with the second switch SW4 and coupled between the inverting input terminal and the output terminal of the operational amplifier 4221. The combination of the second capacitor C2 and the second switch SW4 is connected in parallel with the combination of the first capacitor C1 and the first switch SW3. The control signal S2 and a control signal $\overline{S2}$ respectively control the first switch SW3 and the second switch SW4, wherein the control signal $\overline{S2}$ is an inverted signal of the control signal S2. The comparator 423 is coupled to the integration circuit 422 and used to compare the integration signal Pout and a reference voltage Vref to generate a comparison signal D1, wherein the reference voltage Vref is a threshold value. While the integration signal Pout is greater than reference voltage Vref, the comparison signal D1 is at a high level (a first level), whereby the reset switch SW2 of the reset circuit 424 is turned on to reset the integration signal Pout. The reset circuit 424 includes a current source 4241 and the reset switch SW2. The reset switch SW2 is coupled between the current source 4241 and the integration circuit 422. While the reset switch SW2 is turned on, the current source 4241 provides a current If to reset the integration signal Pout. The first counter 425 is coupled to the comparator 423 and used to count the number of the comparison signal D1 at the first level in the plurality of turn-on intervals of the light source 41 (such as the turn-on intervals Ton1, Ton2, Ton3, and Ton4 shown in FIG. 6) during the measurement time interval Ts so as to generate a first sensing value O_on. The second counter 426 is coupled to the comparator 423 and used to count the number of the comparison signal D1 at the high level in the plurality of turn-off intervals of the light source 41 (such as the turn-on intervals Toff1, Toff2, Toff3, and Toff4 shown in FIG. 6) during the measurement time interval Ts so as to generate a second sensing value O_off. The combination of the integration circuit 422, the comparator 423, the reset circuit 424, the first counter 425, and the second counter 426 may be regarded as an analog-to-digital converter. The signal processor 427 is coupled to the first counter 425 and the second counter 426 and determines whether the object 20 is approaching according to the first sensing value O_on and the second sensing value O_off. In one embodiment, the signal processor 427 may be disposed in the exterior of the proximity sensor 40.

Figure 5:
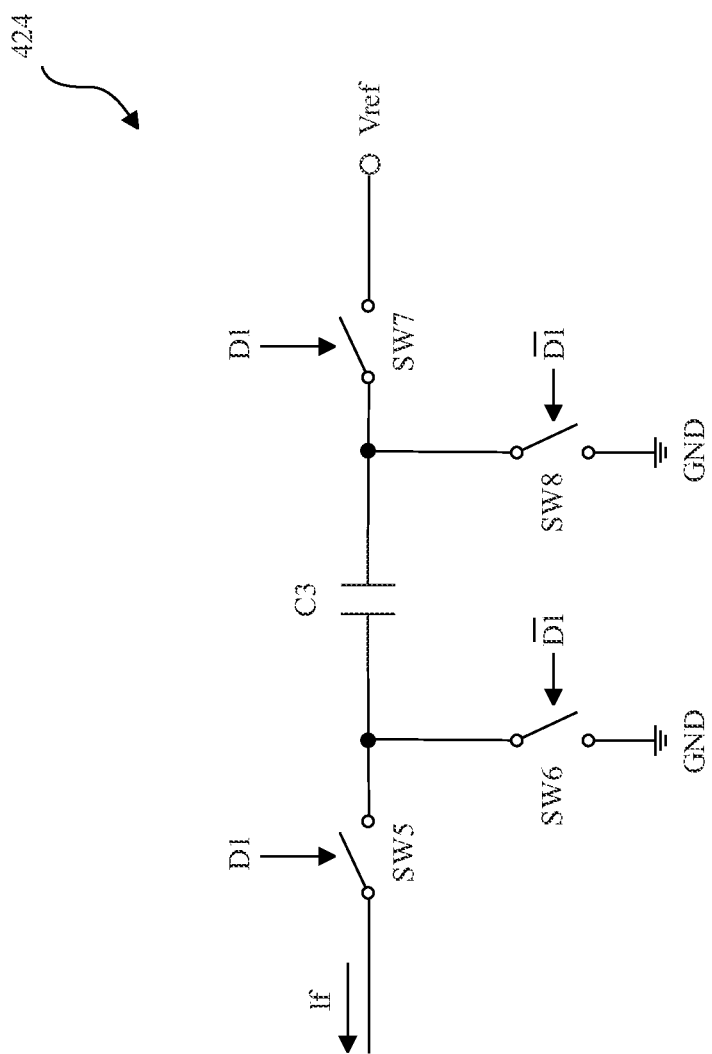
FIG. 5 schematically shows another embodiment of the reset circuit in FIG. 4.

FIG. 5 schematically shows another embodiment of the reset circuit 424 in FIG. 4. The reset circuit 424 in FIG. 5 includes a switch capacitor (switch-C) circuit, which is connected with a reference voltage Vref. The switch capacitor circuit includes a capacitor C3, a first reset switch SW5, a second reset switch SW6, a third reset switch SW7, and a fourth reset switch SW8. The first reset switch SW5 is coupled between a first terminal of the capacitor C3 and the integration circuit 422 and controlled by the comparison signal D1. The second reset switch SW6 is coupled between the first terminal of the capacitor C3 and the ground terminal GND and controlled by the a signal $\overline{D1}$, wherein $\overline{D1}$ is an inverted signal of the comparison signal D1. The third reset switch SW7 is coupled between a second terminal of the capacitor C3 and the reference voltage Vref and controlled by the comparison signal D1. The reference voltage is provided by a voltage source (not shown in the drawing). The fourth reset switch SW8 is coupled between the second terminal of the capacitor C3 and the ground terminal and controlled by the comparison signal $\overline{D1}$. While the comparison signal D1 is at the high level, the first reset switch SW5 and the third reset switch SW7 are turned on, and the second reset switch SW6 and the fourth reset switch SW8 are turned off, and the capacitor C3 provides the current If to reset the integration signal Pout.

Figure 1:
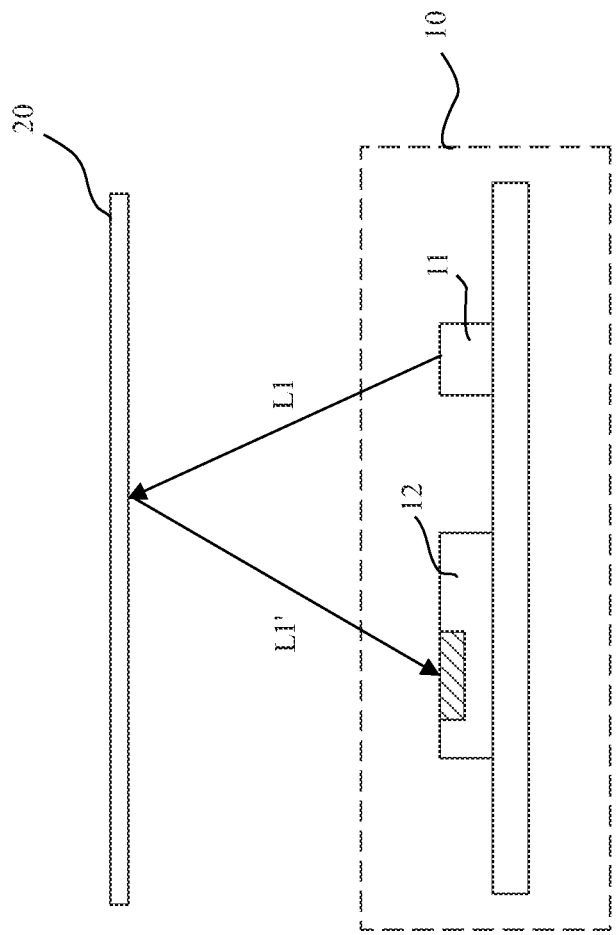
FIG. 1 shows a traditional proximity sensor.
Figure 2:
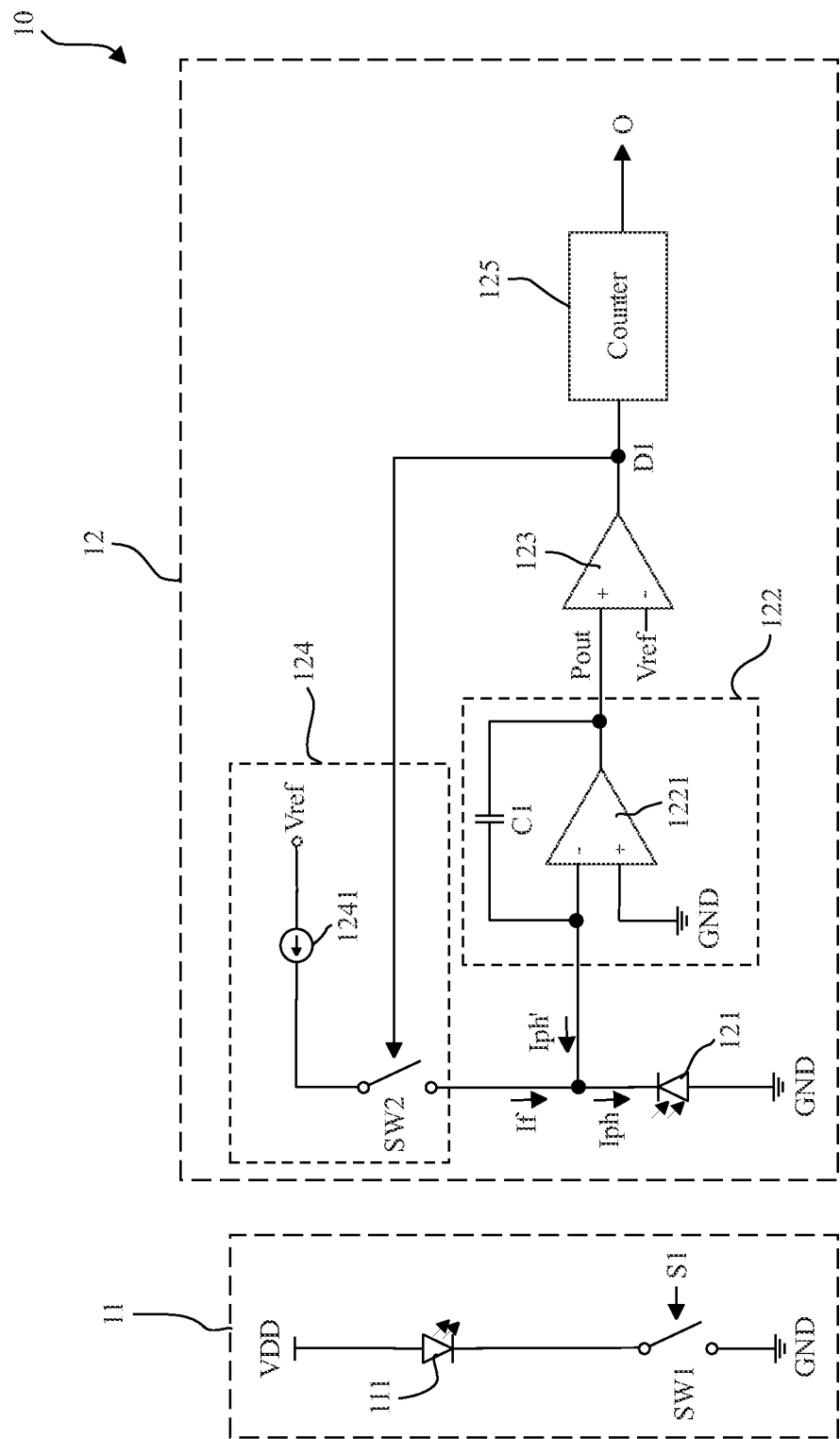
FIG. 2 shows the circuit of the proximity sensor shown in FIG. 1.
Figure 3:
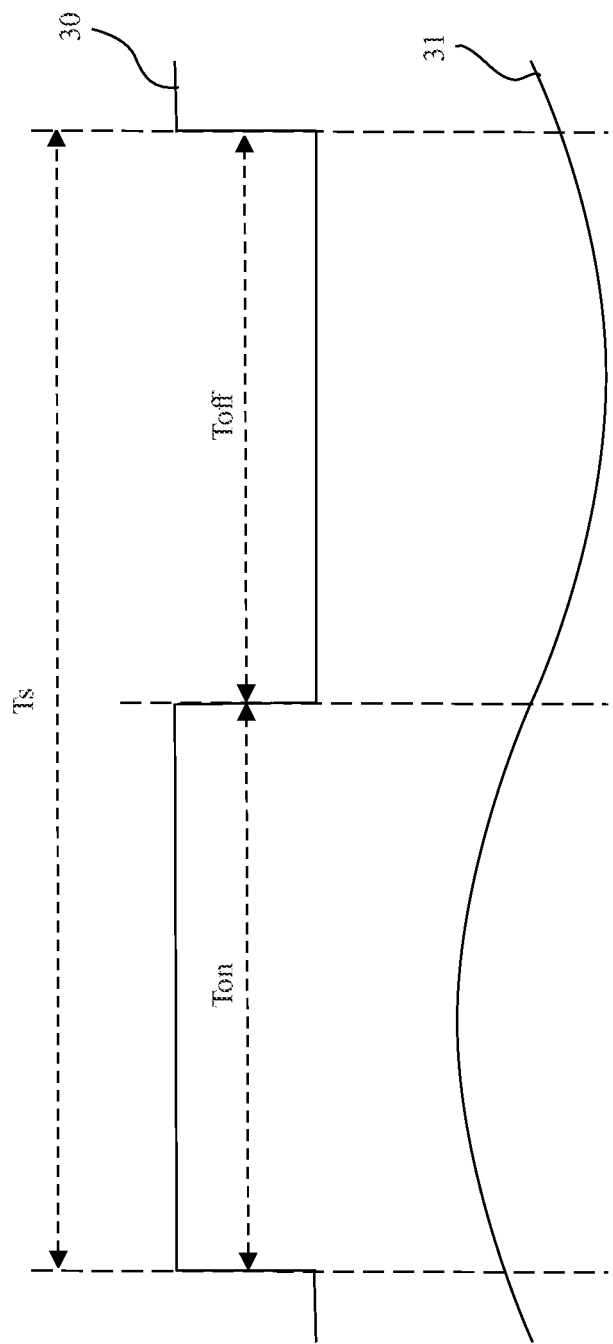
FIG. 3 is to explain the sensing method of the proximity sensor shown in FIG. 2.
Figure 6:
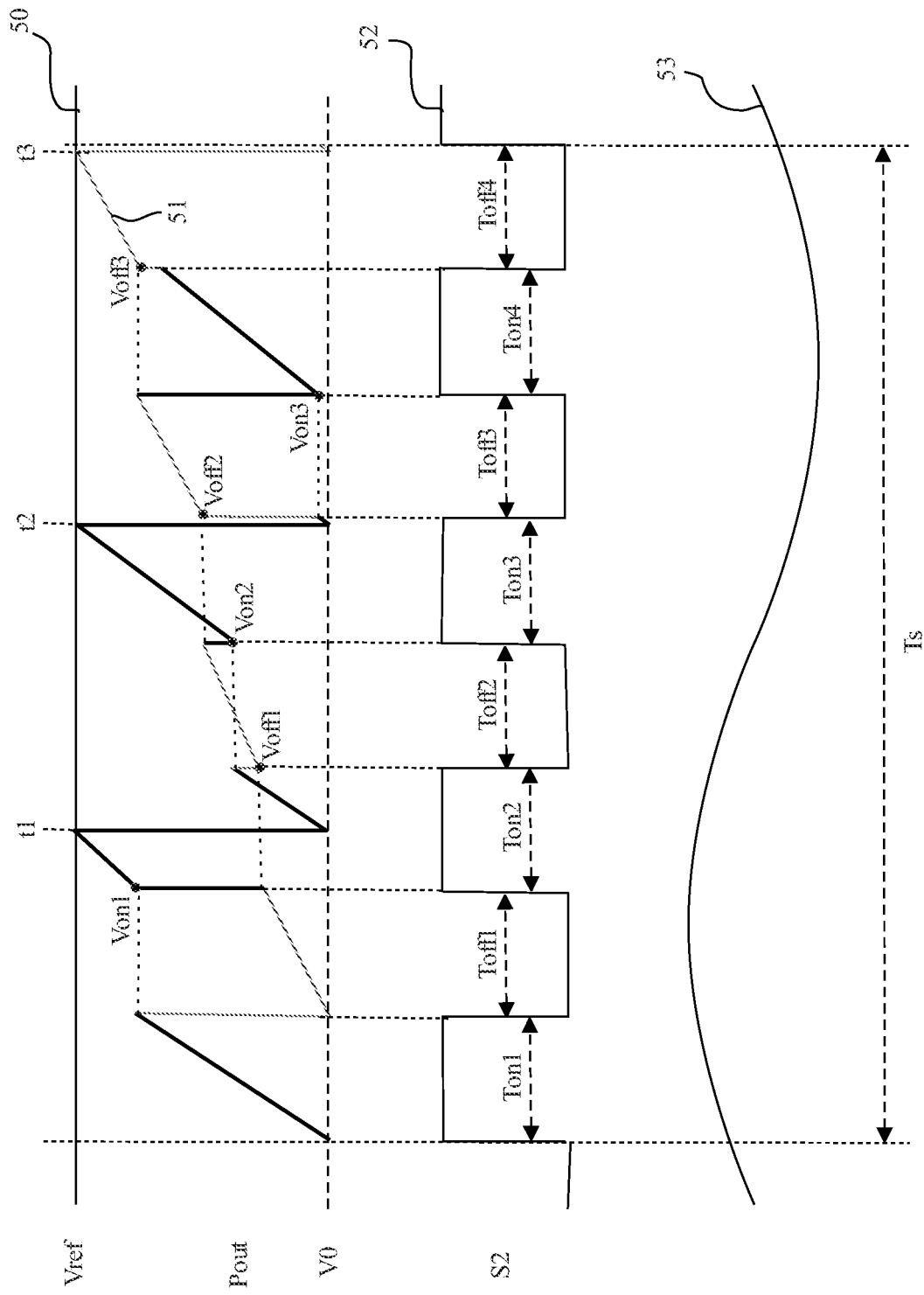
FIG. 6 schematically shows a sensing method of a proximity sensor according to one embodiment of the present invention.

FIG. 6 schematically shows a sensing method of the proximity sensor according to one embodiment of the present invention, wherein the waveform 50 represents the reference voltage Vref; the waveform 51 represents the integration signal Pout; the waveform 52 represents the control signal S2; the waveform 53 represents the intensity of the ambient light. As shown in FIG. 6, the control signal S2, which is used to control the light source 41, has a plurality of pulses during a measurement time interval Ts. In comparison with the traditional proximity sensor 10 where the light source 11 is only respectively turned on and turned off once during the measurement time interval Ts, the light source 41 of the proximity sensor 40 of the present invention is turned on and turned off several times during the same measurement time interval Ts. Each of the turn-on intervals Ton1, Ton2, Ton3, and Ton4 of the light source 41 is shorter than the turn-on interval Ton in FIG. 3 and each of the turn-off intervals Toff1, Toff2, Toff3, and Toff4 of the light source 41 is shorter than the turn-off interval Ton in FIG. 3. Therefore, the difference of the intensities of the ambient light in the adjacent turn-on interval and turn-off interval (such as Ton1 and Toff1) of the light source 41 is smaller. The influence of the ambient light will be effectively reduced via subtracting the sensing value obtained in the turn-off intervals Toff1, Toff2, Toff3, and Toff4 from the sensing value obtained in the turn-on intervals Ton1, Ton2, Ton3, and Ton4. Thereby, the accuracy of the proximity sensor 40 is increased. In FIG. 6, the length of the turn-on interval Ton1 of the light source is equal to the length of the turn-on interval Toff1 of the light source; the length of the turn-on interval Ton2 of the light source is equal to the length of the turn-on interval Toff2 of the light source; the length of the turn-on interval Ton3 of the light source is equal to the length of the turn-on interval Toff3 of the light source; the length of the turn-on interval Ton4 of the light source is equal to the length of the turn-on interval Toff4 of the light source.

Next is explained the operation of the proximity sensor 40 during the measurement time interval Ts. In order to explain conveniently, the current Iph, which is generated by the optical sensing element 421 in the turn-on intervals of the light source Ton1, Ton2, Ton3, and Ton4, is called the first current; the current Iph, which is generated by the optical sensing element 421 in the turn-off intervals of the light source Toff1, Toff2, Toff3, and Toff4, is called the second current.

Refer to FIG. 4 and FIG. 6. During the turn-on interval Ton1, the control signal S2 is at a high level; the switch SW1 is turned on to make the light source 41 emit a light L1; the optical sensing element 421 senses the reflected light L1' and the ambient light to generate a first current Iph=Iph'. At the same time, the first switch SW3 and the second switch SW4 of the integration circuit 422 are respectively turned on and turned off. Through the operational amplifier 4221 and the capacitor C1, the integration circuit 422 integrates the first current Iph to generate the integration signal Pout=P1 (P1 is called the first integration signal thereinafter). While the turn-on interval Ton1 ends, the control signal S2 becomes at a low level to make the first switch SW3 turned off and the second switch SW4 turned on. Meanwhile, the capacitor C1 stores the value of the first integration signal P1. In order to understand easily, the integration signals Pout appearing in the turn-on intervals of the light source Ton1, Ton2, Ton3, and Ton4 are presented in boldface lines in FIG. 6. In other words, the first integration signals P1 of the integration signals Pout are presented in boldface lines.

During the turn-off interval Toff1, the control signal S2 is at a low level; the switch SW1 is turned off to turn off the light source 41; the optical sensing element 421 senses the ambient light to generate a second current Iph=Iph'. At this time, the first switch SW3 and the second switch SW4 of the integration circuit 422 are respectively turned off and turned on. Through the operational amplifier 4221 and the capacitor C2, the integration circuit 422 integrates the second current Iph to generate the integration signal Pout=P2 (P2 is called the second integration signal thereinafter). While the turn-off interval Toff1 ends, the control signal S2 becomes at the high level to make the first switch SW3 turned on and the second switch SW4 turned off. Meanwhile, the capacitor C2 stores the value of the second integration signal P2, and the capacitor C1 provides the stored first integration signal P1. In other words, the integration signal Pout returns to the value obtained at the end of the turn-on interval Ton1.

During the turn-on interval Ton2, the control signal S2 once again turns on the switch SW1 and SW3 and turns off the SW4; the light source 41 emits the light L1; the optical sensing element 421 senses the reflected light L1' and the ambient light to generate the first current Iph=Iph'. The integration circuit 422 integrates the first current Iph, whereby the first integration signal P1 is increased. The starting value Von1 of the first integration signal P1 of the integration circuit 422 in the turn-on interval Ton2 is the value of the first integration signal P1 that the capacitor C1 stores beforehand. At the time point t1 in FIG. 6, while the first integration signal P1 is greater than the reference voltage Vref (the threshold value), the comparison signal D1 outputted by the comparator 423 is at a high level, whereby the switch SW2 of the reset circuit 424 is turned on to reset the first integration signal P1 to a preset starting value V0. Meanwhile, the control signal S2 triggers the first counter 425 and shuts down the second counter 426. In response to the comparison signal D1 is at the high level, the counting value of the first counter 425 is increased by 1. After the first integration signal P1 returns to the starting value V0, the integration circuit 422 continues to integrate the first current Iph, whereby the first integration signal P1 rises again. While the turn-on interval Ton2 ends, the control signal S2 becomes at a low level to make the first switch SW3 turned off and the second switch SW4 turned on. Meanwhile, the capacitor C1 stores the present value of the first integration signal P1, and the second capacitor C2 provides the value of the second integration signal P2 stored beforehand. In other words, the integration signal Pout returns to the value obtained at the end of the turn-off interval Toff1.

During the turn-off interval Toff2, the switch SW1 is turned off to turn off the light source 41; the optical sensing element 421 senses the ambient light to generate a second current Iph=Iph'. At the same time, the first switch SW3 and the second switch SW4 of the integration circuit 422 are respectively turned off and turned on. Through the operational amplifier 4221 and the capacitor C2, the integration circuit 422 integrates the second current Iph. Thus, the second integration signal P2 continues to increase, wherein the starting value Voff1 of the second integration signal P2 of the integration circuit 422 in the turn-off interval Toff2 is the value of the second integration signal P2 that the capacitor C2 stores beforehand. While the turn-off interval Toff2 ends, the control signal S2 becomes at a high level to make the first switch SW3 turned on and the second switch SW4 turned off. Meanwhile, the capacitor C2 stores the present value of the second integration signal P2, and the capacitor C1 provides the stored first integration signal P1.

During the turn-on interval Ton3, the switch SW1 is turned on to make the light source 41 emit the light L1; the optical sensing element 421 senses the reflected light L1' and the ambient light to generate the first current Iph=Iph'. The integration circuit 422 integrates the first current Iph, whereby the first integration signal P1 continues to increase. The starting value Von2 of the first integration signal P1 of the integration circuit 422 in the turn-on interval Ton3 is the value of the first integration signal P1 that the capacitor C1 stores beforehand. At the time point t2 in FIG. 6, while the first integration signal P1 is greater than the reference voltage Vref (the threshold value), the comparison signal D1 outputted by the comparator 423 is at a high level, whereby the switch SW2 is turned on to reset the first integration signal P1 to the starting value V0. Meanwhile, the first counter 425 is triggered. In response to the comparison signal D1 is at the high level, the counting value of the first counter 425 is increased by 1. While the turn-on interval Ton3 ends, the control signal S2 becomes at a low level to make the first switch SW3 turned off and the second switch SW4 turned on. Meanwhile, the capacitor C1 stores the present value of the first integration signal P1, and the second capacitor C2 provides the second integration signal P2 stored beforehand.

During the turn-off interval Toff3, the switch SW1 is turned off to turn off the light source 41; the optical sensing element 421 senses the ambient light to generate a second current Iph=Iph'. The integration circuit 422 integrates the second current Iph-off1 to make the second integration signal P2 rises from Voff2 which is the voltage level at the end of the turn-off interval Toff2. While the turn-off interval Toff3 ends, the control signal S2 becomes at a high level to make the first switch SW3 turned on and the second switch SW4 turned off. Meanwhile, the capacitor C2 stores the present value of the second integration signal P2, and the capacitor C1 provides the stored first integration signal P1.

During the turn-on interval Ton4, the switch SW1 is turned on to make the light source 41 emit the light L1; the optical sensing element 421 senses the reflected light L1' and the ambient light to generate the first current Iph=Iph'. The integration circuit 422 integrates the first current Iph, whereby the first integration signal P1 rises from Von3 which is the voltage level at the end of the turn-on interval Ton3. While the turn-off interval Ton4 ends, the control signal S2 becomes at a low level to make the first switch SW3 turned off and the second switch SW4 turned on. Meanwhile, the capacitor C1 stores the present value of the first integration signal P1, and the capacitor C2 provides the stored second integration signal P2.

During the turn-off interval Toff4, the switch SW1 is turned off to turned off the light source 41; the optical sensing element 421 senses the ambient light to generate a second current Iph=Iph'. The integration circuit 422 integrates the second current Iph to make the second integration signal P2 rises from the level of Voff3 which is the voltage level at the end of the turn-off interval Toff3. At the time point t3 in FIG. 6, while the second integration signal P2 is greater than the reference voltage Vref (the threshold value), the comparison signal D1 outputted by the comparator 423 is at a high level, whereby the switch SW2 is turned on to reset the second integration signal P2 to the starting value V0. Meanwhile, the control signal S2 turns off the first counter 425 and triggers the second counter 426. In response to the comparison signal D1 is at the high level, the counting value of the second counter 426 is increased by 1.

After the measurement time interval Ts ends, the first counter 425 and the second counter 426 respectively generate a first sensing value O_on and a second sensing value O_off according to their own counting values to the signal processor 427. According to the first sensing value O_on and the second sensing value O_off, the signal processor 427 determines whether the object 20 is approaching. For example, the signal processor 427 may subtract the second sensing value O_off from the first sensing value O_on to obtain a difference value. While the difference value is greater than or equal to a preset value, the signal processor 427 determines that the object 20 is approaching. While the difference value is smaller than the preset value, the signal processor 427 determines that no object 20 is approaching.

In the embodiment shown in FIG. 6, the control signal S2 has four pulses in the measurement time interval Ts. However, the present invention is not limited by the embodiment. The number of the pulses of the control signal S2 may be increased or decreased in the measurement time interval according to requirement. As long as the number of the pulses of the control signal S2 is greater than 1 in the measurement time interval Ts, the technical scheme would be within the scope of the present invention.

In the proximity sensor 40 of the present invention, an identical integration circuit 422 is used to integrate the current Iph' in the turn-on intervals Ton1, Ton2, Ton3, and Ton4 of the light source and the turn-off intervals Toff1, Toff2, Toff3, and Toff4 of the light source. Therefore, the present invention can prevent from the errors induced by the offset of different integration circuits. In details, suppose that a first integration circuit is used to integrate the current Iph' in in the turn-on intervals Ton1, Ton2, Ton3, and Ton4 of the light source and that a second integration circuit is used to integrate the current Iph' in the turn-off intervals Toff1, Toff2, Toff3, and Toff4 of the light source; while the first integration circuit is switched to the second integration or vice versa, the offset between the first integration circuit and the second integration will make the parasitic capacitance of the optical sensing element 421 generate a great pseudo-current, which may further cause the first integration circuit or the second integration circuit to generate a false integration signal; thus the accuracy of the proximity sensor is decreased.

The embodiments described above are only to exemplify the present invention but not to limit the present invention. Any modification or variation made by the persons having ordinary knowledge in the art according to the spirit of the present invention would not depart from the scope of the present invention. Therefore, any equivalent modification or variation according to the spirit of the present invention would be included by the scope of the present invention.

What is claimed is:

1. A proximity sensor comprising:
   a light source configured to generate a light, wherein the light source is turned on and off several times during a measurement time interval;
   an optical sensing element configured to sense a reflected light and an ambient light, wherein the reflected light is caused by an object reflecting the light, wherein while the light source is turned on, the optical sensing element generates a first current, and wherein while the light source is turned off, the optical sensing element generates a second current;
   an integration circuit, coupled to the optical sensing element, configured to integrate the first current and the second current to respectively generate a first integration signal and a second integration signal, wherein the integration circuit includes:
      an operational amplifier, having a non-inverting input terminal, an inverting input terminal, and an output terminal, wherein the non-inverting terminal is coupled to a ground terminal, and the inverting input terminal is coupled to the optical sensing element;
      a first capacitor;
      a first switch, turned on while the light source is turned on and connected in series with the first capacitor, wherein the first capacitor and the first switch are coupled between the inverting input terminal and the output terminal to generate the first integration signal;
      a second capacitor; and
      a second switch, turned on while the light source is turned off, connected in series with the second capacitor, and connected in parallel with the first switch, wherein the second capacitor and the second switch are coupled between the inverting input terminal and the output terminal and are configured to generate the second integration signal;
   a comparator, coupled to the integration circuit, configured to compare the first integration signal and the second integration signal with a threshold value to generate a comparison signal, wherein while the first integration signal is greater than the threshold value, the comparison signal is at a first level to reset the first integration signal; while the second integration signal is greater than the threshold value, the comparison signal is at the first level to reset the second integration signal;
   a first counter, coupled to the comparator, configured to count a number that the comparison signal is at the first level in a plurality of turn-on intervals of the light source during the measurement time interval so as to generate a first sensing value;
   a second counter, coupled to the comparator, configured to count a number that the comparison signal is at the first level in a plurality of turn-off intervals of the light source during the measurement time interval so as to generate a second sensing value; and
   a reset circuit, coupled to the integration circuit, configured to reset the first integration signal according to the comparison signal that is at the first level while the light source is turned on and reset the second integration signal according to the comparison signal that is at the first level while the light source is turned off.

2. The proximity sensor according to claim 1, wherein the reset circuit comprises:
   a current source; and
   a reset switch, coupled between the current source and the integration circuit, wherein the reset switch is turned on by the comparison signal.

3. The proximity sensor according to claim 1, wherein the reset circuit comprises a switch capacitor circuit coupled to a reference voltage, wherein the switch capacitor circuit further comprises:
   a capacitor, having a first terminal and a second terminal;
   a first reset switch, coupled between the first terminal and the integration circuit;
   a second reset switch, coupled between the first terminal and a ground terminal;
   a third reset switch, coupled between the second terminal and the reference voltage; and
   a fourth reset switch, coupled between the second terminal and the ground terminal,
   wherein while the first integration signal or the second integration signal is greater than the threshold value, the first reset switch and the third reset switch are turned on, and the second reset switch and the fourth reset switch are turned off, whereby to reset the first integration signal or the second integration signal.

4. The proximity sensor according to claim 1, further comprising a signal processor, which is coupled to the first counter and the second counter, configured to determine whether the object is approaching according to the first sensing value and the second sensing value.

* * * * *